United States Patent
Mikami

(10) Patent No.: US 8,986,910 B2
(45) Date of Patent: Mar. 24, 2015

(54) OPTICAL MEMBER FOR EUV LITHOGRAPHY

(75) Inventor: Masaki Mikami, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 175 days.

(21) Appl. No.: 13/472,002

(22) Filed: May 15, 2012

(65) Prior Publication Data

US 2012/0225375 A1 Sep. 6, 2012

Related U.S. Application Data

(63) Continuation of application No. PCT/JP2010/072047, filed on Dec. 8, 2010.

(30) Foreign Application Priority Data

Dec. 9, 2009 (JP) ................................ 2009-279401

(51) Int. Cl.
*G03F 1/24* (2012.01)
*B82Y 10/00* (2011.01)
*B82Y 40/00* (2011.01)
*G02B 5/08* (2006.01)
*G03F 7/20* (2006.01)

(52) U.S. Cl.
CPC . *G03F 1/24* (2013.01); *B82Y 10/00* (2013.01); *B82Y 40/00* (2013.01); *G02B 5/0891* (2013.01); *G03F 7/70316* (2013.01); *G03F 7/70958* (2013.01); *G03F 7/70983* (2013.01)
USPC .......................................................... 430/5

(58) Field of Classification Search
CPC ........................................................ G03F 1/24
USPC ........................................................ 430/4–5
See application file for complete search history.

(56) References Cited

U.S. PATENT DOCUMENTS

| | | | |
|---|---|---|---|
| 5,928,817 A | 7/1999 | Yan et al. | |
| 5,958,605 A | 9/1999 | Montcalm et al. | |
| 6,410,193 B1 | 6/2002 | Stivers et al. | |
| 6,479,195 B1 | 11/2002 | Kirchauer et al. | |
| 6,506,526 B2 | 1/2003 | Stivers et al. | |
| 6,583,068 B2 | 6/2003 | Yan et al. | |
| 6,593,037 B1 | 7/2003 | Gabriel et al. | |
| 6,593,041 B2 | 7/2003 | Yan | |
| 6,596,465 B1 | 7/2003 | Mangat et al. | |
| 6,607,862 B2 | 8/2003 | Yan et al. | |
| 6,610,447 B2 | 8/2003 | Yan et al. | |
| 6,627,362 B2 | 9/2003 | Stivers et al. | |
| 6,630,273 B2 | 10/2003 | Yan et al. | |
| 6,645,679 B1 | 11/2003 | La Fontaine et al. | |
| 6,653,053 B2 | 11/2003 | Mangat et al. | |
| 6,699,625 B2 | 3/2004 | Lee et al. | |
| 6,720,118 B2 | 4/2004 | Yan et al. | |
| 6,780,496 B2 | 8/2004 | Bajt et al. | |
| 6,797,368 B2 | 9/2004 | Shoki | |
| 6,818,357 B2 | 11/2004 | Yan | |
| 6,830,851 B2 | 12/2004 | Yan | |
| 6,905,801 B2 | 6/2005 | Liang et al. | |
| 6,908,713 B2 | 6/2005 | Silverman | |
| 6,908,714 B2 | 6/2005 | Yan et al. | |
| 6,913,706 B2 | 7/2005 | Yan et al. | |
| 6,998,200 B2 | 2/2006 | Lee | |
| 7,078,134 B2 | 7/2006 | Wurm et al. | |
| 7,090,948 B2 | 8/2006 | Rau | |
| 7,118,832 B2 | 10/2006 | Yan | |
| 7,172,788 B2 | 2/2007 | Yakshin et al. | |
| 7,300,724 B2 | 11/2007 | Yan | |
| 7,384,715 B2 | 6/2008 | Lee | |
| 7,833,682 B2 | 11/2010 | Hayashi et al. | |
| 7,906,259 B2 | 3/2011 | Hayashi et al. | |
| 8,088,538 B2 | 1/2012 | Hayashi et al. | |
| 8,121,254 B2 | 2/2012 | Murakami et al. | |
| 2003/0008148 A1 | 1/2003 | Bajt et al. | |
| 2003/0162005 A1* | 8/2003 | Shoki | 430/5 |
| 2006/0270226 A1* | 11/2006 | Hosoya | 430/5 |
| 2008/0182183 A1* | 7/2008 | Hayashi et al. | 430/5 |

FOREIGN PATENT DOCUMENTS

| | | |
|---|---|---|
| EP | 1 065 568 | 1/2001 |
| JP | 2001-523007 | 11/2001 |
| JP | 2005-516182 | 6/2005 |

(Continued)

OTHER PUBLICATIONS

U.S. Appl. No. 13/937,771, filed Jul. 9, 2013, Mikami.
U.S. Appl. No. 13/727,305, filed Dec. 26, 2012, Mikami, et al.
International Search Report issued Mar. 15, 2011 in PCT/JP2010/072047 filed Dec. 8, 2010.
U.S. Appl. No. 13/443,108, filed Apr. 10, 2012, Mikami, et al.
U.S. Appl. No. 13/469,161, filed May 11, 2012, Mikami.
U.S. Appl. No. 13/478,532, filed May 23, 2012, Mikami, et al.

*Primary Examiner* — Christopher Young

(74) *Attorney, Agent, or Firm* — Oblon, McClelland, Maier & Neustadt, L.L.P.

(57) ABSTRACT

There are provided an EUV optical member, in which deterioration in the reflectivity due to oxidation of the Ru protective layer is prevented, a functional film-equipped substrate to be employed for production of the EUV optical member. A reflective layer-equipped substrate for EUV lithography comprising a substrate, and a reflective layer for reflecting EUV light and a protective layer for protecting the reflective layer, formed in this order on the substrate, wherein the reflective layer is a Mo/Si multilayer reflective film, the protective layer has a three-layer structure wherein a first layer made of a Ru layer or a Ru compound layer, a second layer made of a Mo layer and a third layer made of a Ru layer or a Ru compound layer are laminated in this order on the reflective layer.

20 Claims, 2 Drawing Sheets

(56) References Cited

FOREIGN PATENT DOCUMENTS

| | | |
|---|---|---|
| JP | 2005-268750 | 9/2005 |
| JP | 2006-170916 | 6/2006 |
| JP | 4068285 | 1/2008 |
| WO | WO 2008/090988 | 7/2008 |

* cited by examiner

OPTICAL MEMBER FOR EUV LITHOGRAPHY

TECHNICAL FIELD

The present invention relates to an optical member for EUV (Extreme Ultraviolet: hereinafter referred to as "EUV") employed for, e.g. the production of semiconductors, specifically, a reflective layer-equipped substrate for EUV lithography (hereinafter referred to as "reflective layer-equipped substrate for EUV lithography" or simply "reflective layer-equipped substrate" in this specification), a reflective mask blank for EUV lithography, (hereinafter referred to as "EUV mask blank" in this specification), a reflective mask for EUV lithography obtainable by patterning the EUV mask blank (hereinafter referred to as "EUV mask" in this specification), and a reflective mirror for EUV lithography (hereinafter referred to as "EUV mirror" in this specification)(hereinafter collectively also referred to as "optical member for EUV lithography" in this specification).

BACKGROUND ART

Heretofore, in the semiconductor industry, a photolithography method employing visible light or ultraviolet light has been used as a technique to transfer a fine pattern required to form an integrated circuit with a fine pattern on e.g. a silicon substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (193 nm) is employed, about 45 nm is presumed to be the limit. Under the circumstances, as an exposure technique for the next generation employing an exposure wavelength shorter than 45 nm, EUV lithography is expected to be prospective, which is an exposure technique employing EUV light having a wavelength further shorter than ArF laser. In this specification, EUV light is meant for light a ray having a wavelength within a soft X-ray region or within a vacuum ultraviolet region, specifically for a light ray having a wavelength of from about 10 to 20 nm, particularly about 13.5 nm±0.3 nm.

EUV light is likely to be absorbed by all kinds of substances, and the refractive index of substances at such a wavelength is close to 1, whereby it is not possible to use a conventional refracting optical system like photolithography employing visible light or ultraviolet light. Therefore, in EUV lithography, a reflective optical system, i.e. a combination of a reflective photomask and a mirror, is employed.

A mask blank is a laminate before pattering, to be employed for the production of a photomask. In the case of an EUV mask blank, it has a structure wherein a reflective layer to reflect EUV light and an absorber layer to absorb EUV light, are formed in this order on a substrate made of e.g. glass. As the reflective layer, it is common to use a Mo/Si multilayer reflective film having a molybdenum (Mo) layer as a low refractive index layer and a silicon (Si) layer as a high refractive index layer alternately laminated to have the light reflectivity improved when the layer surface is irradiated with EUV light.

For the absorber layer, a material having a high absorption coefficient to EUV light, specifically e.g. a material containing chromium (Cr) or tantalum (Ta) as the main component, is used.

Usually, a protective layer is formed between the above-described reflective layer and the absorber layer. Such a protective layer is one to be provided for the purpose of protecting the reflective layer, so that the reflective layer will not be damaged by an etching process to be carried out for the purpose of forming a pattern on the absorber layer. In Patent Document 1, it is proposed to use ruthenium (Ru) as the material for the protective layer. In Patent Document 2, a protective layer is proposed which is made of a ruthenium compound (Ru content: 10 to 95 at %) containing Ru and at least one member selected from Mo, Nb, Zr, Y, B, Ti and La. In Patent Document 3, a multilayer protective layer is proposed which is made of a pair of Ru and Si.

A mirror to be used for EUV lithography has a structure wherein a reflective layer for reflecting EUV light is formed on a substrate made of e.g. glass. As the reflective layer, a multilayer reflective film having high refractive index layers and low refractive index layers alternately laminated plural times is usually used, since a high EUV light reflectivity can be thereby accomplished. Therefore, as a mirror to be used for EUV lithography, such a multilayer mirror having a multi-layer reflective film formed on a substrate is usually employed (Patent Document 4).

In such a multilayer mirror, a protective layer (protective capping layer) is formed on such a multilayer reflective film for the purpose of protecting the multilayer reflective film from chemical or physical erosion in many cases. Patent Document 4 discloses that an EUV mirror is configured such that a specific capping layer (protective layer) is formed on a reflective layer for the purpose of having resistance to chemical or physical erosion. The multilayer mirror disclosed in Patent Document 4 is provided with a protective capping layer made of a material selected from ruthenium (Ru) and rhodium (Rh), and their compounds and alloys.

PRIOR ART DOCUMENTS

Patent Documents

Patent Document 1: JP-A-2002-122981
Patent Document 2: JP-A-2005-268750
Patent Document 3: U.S. Pat. No. 7,300,724
Patent Document 4: Japanese Patent No. 4,068,285 (EP-A-1065568)

DISCLOSURE OF INVENTION

Technical Problem

In a case where Ru is employed as the material for the protective layer, a high etching selectivity can be obtained to the absorber layer. Further, even in a case where the protective layer is formed on the reflective layer, a high reflectivity is obtainable when the protective layer surface is irradiated with EUV light.

However, in a case where Ru is employed as the material for the protective layer, there is a problem such that the EUV light reflectivity at the time when the protective layer surface is irradiated with EUV light deteriorates, since the Ru protective layer and further, the uppermost layer of the multilayer reflective film (the Si layer in the case of the Mo/Si multilayer reflective film) are oxidized in a step for producing a mask blank or a mirror or a step for producing a photomask from such a mask blank (such as in each of cleaning, defect inspection, heating, dry etching and defect correction) or during such EUV exposure.

Especially, deterioration in the EUV light reflectivity during the EUV exposure progresses as the time passes, thus leading to such a problem that it is required to change the exposure conditions in a half way with the result that the useful life of the photomask or the mirror tends to be short.

Hereinafter, in this specification, deterioration in the EUV light reflectivity at the time when the protective layer surface is irradiated with EUV light, due to oxidation of the Ru protective layer and further the uppermost layer of the multilayer reflective film in a step for producing a mask blank or a mirror or a step for producing a photomask from the mask blank (such as cleaning, defect inspection, heating, dry etching and defect correction) or during such EUV exposure, will be also referred to simply as "deterioration in the EUV light reflectivity due to oxidation of the Ru protective layer".

The protective layer as disclosed in Patent Document 2 is to bring about no deterioration in the reflectivity of the multilayer reflective film and yet to provide a sufficient effect to prevent oxidation of the multilayer reflective film. However, as is apparent from the disclosure in paragraph [0006] in this document, the deterioration in the reflectivity of the multilayer reflection film mentioned here means that by e.g. heat treatment during the formation of the Ru protective layer or subsequent heat treatment, the Ru protective layer and the Si layer as the upper layer of the multilayer reflective film are likely to form a diffused layer, whereby the reflectivity is likely to be deteriorated, but there is no mention about deterioration in the EUV light reflectivity due to oxidation of the Ru protective layer as described above.

The protective layer disclosed in Patent Document 3 is provided as a multilayer protective layer made of a pair of Ru and Si in order to solve both problems of deterioration in a Si layer due to oxidation and of impossibility of an increase in a film thickness due to the presence of the Ru layer having a higher absorption coefficient of EUV light than the Si layer, but there is no mention about deterioration in the EUV light reflectivity due to oxidation of the Ru protective layer as described above.

From the above-described viewpoint, it is an object of the present invention to provide an optical member, such as an EUV mask blank and an EUV mirror, in which deterioration in the EUV light reflectivity due to oxidation of the Ru protective layer is prevented, and a functional film-equipped substrate to be employed for the production of such an optical member.

Solution to Problem

The present inventor has conducted an extensive study to solve the above-described problem and as a result, has found it possible to suppress the deterioration in the EUV light reflectivity due to oxidation of the Ru protective layer by interposing a thin Mo layer between Ru protective layers.

Further, the present inventor has found that it is effective to set the film thickness of such a Mo layer in the protective layers in a specific range.

The present invention has been made based on the above-described discovery by the present inventor and provides a reflective layer-equipped substrate for EUV lithography (hereinafter also referred to as "the reflective layer-equipped substrate of the present invention" in this specification) comprising a substrate, and a reflective layer for reflecting EUV light and a protective layer for protecting the reflective layer, formed in this order on the substrate, wherein the reflective layer is a Mo/Si multilayer reflective film, the protective layer has a three-layer structure wherein a first layer made of a Ru layer or a Ru compound layer, a second layer made of a Mo layer and a third layer made of a Ru layer or a Ru compound layer are laminated in this order on the reflective layer.

It is preferred that the uppermost layer of the reflective layer made of a Mo/Si multilayer reflective film is a Si film, and the protective layer is formed in contact with the Si film.

In the reflective layer-equipped substrate of the present invention, it is preferred that the film thickness of the second layer is at least 0.2 nm and at most 2 nm, or equal to ½ of the total film thickness of the protective layer, whichever is smaller.

In the reflective layer-equipped substrate of the present invention, it is preferred that the total film thickness of the protective layer is from 1 to 10 nm.

In the reflective layer-equipped substrate of the present invention, it is preferred that the surface roughness rms of the surface of the protective layer is at most 0.5 nm.

Further, the present invention provides a reflective mask blank for EUV lithography (hereinafter referred to also as an "EUV mask blank of the present invention") having an absorber layer formed on the protective layer of the above-described reflective layer-equipped substrate of the present invention.

In the EUV mask blank of the present invention, it is preferred that the absorber layer is made of a material containing tantalum (Ta) as the main component.

In the EUV mask blank of the present invention, it is preferred that the etching selectivity between the protective layer and the absorber layer when subjected to dry etching using a chlorine-type gas as the etching gas, is at least 10.

In the EUV mask blank of the present invention, it is preferred that a low reflective layer to an inspection light to be used for inspection of a mask pattern, made of a material containing tantalum (Ta) as the main component, is formed on the absorber layer.

In the case where a low reflective layer is formed on the absorber layer, it is preferred that the contrast between reflected light on the surface of the protective layer and reflected light on the surface of the low reflective layer, to the wavelength of light to be used for inspection of a pattern formed in the absorber layer, is at least 30%.

Further, the present invention provides a reflective mask for EUV lithography (hereinafter referred to also as an "EUV mask of the present invention") obtainable by patterning the above-described EUV mask blank of the present invention.

Further, the present invention provides a reflective mirror for EUV lithography employing the above-described reflective layer-equipped substrate for EUV lithography of the present invention (hereinafter, referred to as "EUV mirror of the present invention").

Further, the present invention provides a process for producing a semiconductor integrated circuit, which comprises subjecting an object to be exposed to exposure by means of the above-described EUV mask of the present invention to produce a semiconductor integrated circuit.

Advantageous Effects of Invention

In the reflective layer-equipped substrate of the present invention and the EUV mask blank or the EUV mirror employing the reflective layer-equipped substrate, deterioration in the EUV light reflectivity due to oxidation of the Ru protective layer is prevented. And, by prevention of the progress with time of deterioration in the EUV light reflectivity during the EUV exposure, it becomes unnecessary to change the exposure conditions in a half way, and it is possible to prolong the useful life of the EUV mask or the EUV mirror.

Further, the EUV mask prepared by employing the EUV mask blank of the present invention, is a highly reliable EUV mask, whereby a change with time of the EUV light reflectivity is little during the EUV exposure, and the EUV mask is useful in the production of an integrated circuit having a fine pattern.

DESCRIPTION OF EMBODIMENTS

Figure 1:
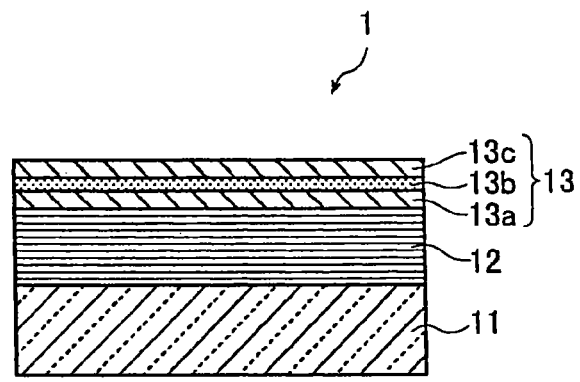
FIG. 1 is a schematic cross-sectional view illustrating an embodiment of the EUV mask blank of the present invention.

Now, the present invention will be described with reference to the drawing.

FIG. 1 is a schematic cross-sectional view illustrating an embodiment of the EUV mask blank of the present invention. An EUV mask blank 1 shown in FIG. 1 has a reflective layer 12 for reflecting EUV light and a protective layer 13 for protecting the reflective layer 12, formed in this order on a substrate 11. In the EUV mask blank of the present invention, the protective layer 13 has a three-layer structure wherein a first layer 13a made of a Ru layer or a Ru compound layer, a second layer 13b made of a Mo layer and a third layer 13c made of a Ru layer or a Ru compound layer are laminated in this order on the reflective layer 12.

Figure 4:
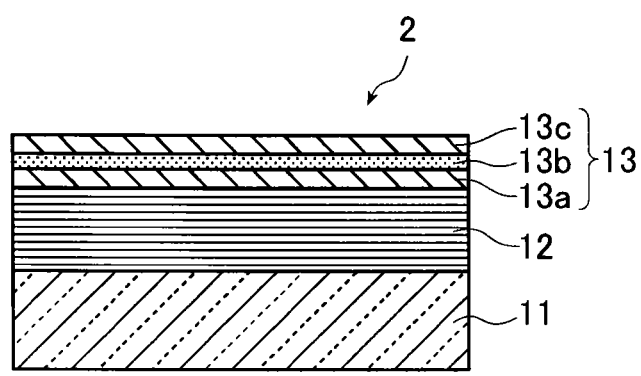
FIG. 4 is a schematic cross-sectional view illustrating an embodiment of the EUV mirror of the present invention.

FIG. 4 is a schematic cross-sectional view illustrating an embodiment of the EUV mirror of the present invention. An EUV mirror 2 shown in FIG. 4 has a reflective layer 12 for reflecting EUV light and a protective layer 13 for protecting the reflective layer 12, formed in this order on a substrate 11. It should be noted that in the EUV mirror of the present invention, the protective layer 13 has a three-layer structure wherein a first layer 13a made of a Ru layer or a Ru compound layer, a second layer 13b made of a Mo layer and a third layer 13c made of a Ru layer or a Ru compound layer are laminated in this order on the reflective layer 12.

Hereinafter, the respective elements constituting the mask blank 1 and the mirror 2 will be described. It should be noted that a member having a multilayer film for reflecting EUV light, such as the mask blank and the mirror, is also called "EUV optical member".

It is required that the substrate 11 satisfies the properties as a substrate for an EUV mask blank. Therefore, it is important that the substrate 11 has a low thermal expansion coefficient. Specifically, the thermal expansion coefficient of the substrate 11 is preferably $0 \pm 1.0 \times 10^{-7}/°C$., more preferably $0 \pm 0.3 \times 10^{-7}/°C$., further preferably $0 \pm 0.2 \times 10^{-7}/°C$., further preferably $0 \pm 0.1 \times 10^{-7}/°C$., particularly preferably $0 \pm 0.05 \times 10^{-7}/°C$. Further, the substrate preferably has a smoothness and a planarity, and is excellent in durability against a cleaning liquid to be used for e.g. cleaning of a mask blank or a photomask after patterning. As the substrate 11, specifically, a glass having a low thermal expansion coefficient, e.g. a $SiO_2$—$TiO_2$ type glass, may be used. However, the substrate is not limited thereto, and it is possible to employ a substrate of, e.g. crystallized glass having β-quartz solid solution precipitated, quartz glass, silicon, or a metal. Further, a film, such as a stress correcting film, may be formed on the substrate 11.

The substrate 11 preferably has a smooth surface having a surface roughness rms of at most 0.15 nm and a flatness of at most 100 nm, whereby a high reflectivity and transfer precision can be attained by a photomask after forming a pattern.

The size, thickness, etc. of the substrate 11 are suitably determined depending upon e.g. the designed values for the mask. In Examples given hereinafter, a $SiO_2$—$TiO_2$ type glass having a size of 6 inch (152.4 mm) square and a thickness of 0.25 inch (6.3 mm) was used. The size of the substrate to be used for the mirror is optionally determined depending upon, e.g. the design values for an exposure tool, and a substrate having a diameter of about 50 to 500 mm is usually used.

The substrate for the mask blank has a planar shape in a rectangular form, such as a square form. On the other hand, the substrate for the mirror has a planar shape in a circular, elliptical or polygonal form in many cases.

It is preferred that no defect is present on the surface of the substrate 11 on the side where a reflective layer 12 is to be formed. However, even in a case where a defect is present, in order not to cause a phase defect due to a concave defect and/or a convex defect, it is preferred that the depth of a concave defect or the height of a convex defect is not more than 2 nm, and the half value width of such a concave defect or convex defect is not more than 60 nm.

The property particularly required for the reflective layer 12 of the EUV optical member is a high EUV light reflectivity. Specifically, when a light ray within an EUV wavelength region is applied at an incident angle of 6° to the surface of the reflective layer 12, the maximum value of the reflectivity of the light ray in the vicinity of a wavelength of 13.5 nm is preferably at least 60%, more preferably at least 65%. Further, even in a case where a protective layer 13 is formed on the reflective layer 12, the maximum value of the reflectivity of a light ray in the vicinity of a wavelength of 13.5 nm is preferably at least 60%, more preferably at least 65%.

As a reflective layer, a multilayer reflective film having a high refractive index layer and a low refractive index layer alternately laminated plural times is widely used, since a high reflectivity can thereby be accomplished in the EUV wavelength region. The EUV optical member of the present invention may include a Mo/Si multilayer reflective film having a Mo film as a low refractive index layer and a Si film as a high refractive index layer alternately laminated plural times. In such a Mo/Si multilayer reflective film, it is preferred that the uppermost layer of the laminated Mo/Si multilayer reflective film is made to be a Si film.

In the case of the Mo/Si multilayer reflective film, in order to obtain a reflective layer 12 having the maximum value of the EUV light reflectivity being at least 60%, a Mo layer having a thickness of 2.3±0.1 nm and a Si layer having a thickness of 4.5±0.1 nm may be laminated repeatedly so that the number of repeating units becomes from 30 to 60.

Here, each layer constituting the Mo/Si multilayer reflective film may be formed to have a desired thickness by means of a film-forming method, such as a magnetron sputtering method or an ion beam sputtering method. For example, in the case of forming a Mo/Si multilayer reflective film by means of an ion beam sputtering method, it is preferred that a Mo layer is formed to have a thickness of 2.3 nm at an ion accelerating voltage of from 300 to 1,500 V and a film-deposition rate of 0.03 to 0.30 nm/sec by using a Mo target as the target and an Ar gas (gas pressure: $1.3\times10^{-2}$ Pa to $2.7\times10^{-2}$ Pa) as the sputtering gas, and then a Si layer is formed to have a thickness of 4.5 nm at an ion accelerating voltage of from 300 to 1,500 V and a film-deposition rate of from 0.03 to 0.30 nm/sec by using a Si target as the target and an Ar gas (gas pressure: $1.3\times10^{-2}$ Pa to $2.7\times10^{-2}$ Pa) as the sputtering gas. When this operation is taken as one cycle, the Mo/Si multilayer reflective film is formed by laminating the Mo layer and the Si layer by from 40 to 50 cycles.

The protective layer 13 is provided for the purpose of protecting the reflective layer 12, so that at the time of forming a pattern in an absorber layer 14 by an etching process, usually, by a dry etching process, the reflective layer 12 will not be damaged by the etching process. Accordingly, as the material for the protective layer 13, a material hardly susceptible to an influence by the etching process of the absorber layer 14 i.e. having an etching rate slower than the absorber layer 14 and hardly susceptible to damage by such an etching process, is selected for use.

Further, the protective layer 13 is preferably configured such that the protective layer 13 itself also has a high EUV light reflectivity in order not to impair the EUV light reflectivity at the reflective layer 12 even after forming the protective layer 13.

From this point of view, Ru is used as the material forming the protective layer of an EUV optical member as disclosed in Patent Documents 1 to 3.

Also in the EUV optical member of the present invention, each of the first layer 13a and the third layer 13c in the three-layer protective layer 13 is a Ru layer or a Ru compound layer. Both of the first layer 13a and the third layer 13c may be Ru layers or may be Ru compound layers. One of the first layer 13a and the third layer 13c may be a Ru layer while the other layer may be a Ru compound layer. As the above-described Ru compound, at least one member selected from a group consisting of RuB, RuNb and RuZr is preferred.

In a case where each of the first layer 13a and the third layer 13c is a Ru compound layer, the content of Ru is preferably at least 50 at %, more preferably at least 80 at %, particularly preferably at least 90 at %. In a case where each of the first layer 13a and the third layer 13c is a RuNb layer, the content of Nb is preferably from 10 to 40 at %.

The content of Si in each of the first layer 13a and the third layer 13c is preferably at most 5 at %, more preferably at most 3 at %, further preferably 1 at %.

In the EUV optical member of the present invention, deterioration in the EUV light reflectivity due to oxidation of the Ru protective layer is prevented by constituting the second layer 13b of the three-layer protective layer 13 by a Mo layer. The reason as to why deterioration in the EUV light reflectivity due to oxidation of the Ru protective layer is prevented by constituting the second layer 13b of the three-layer protective layer 13 by a Mo layer, is considered to be as follows.

If there is a situation where the Ru protective layer is likely to be oxidized in a step to be carried out during the production of a mask blank or a mirror or a step to be carried out during the production of a photomask from the mask blank (such as in each step of cleaning, defect inspection, heating, dry etching, defect correction), or during EUV exposure, the three-layer protective layer 13 is oxidized from the third layer 13c as the uppermost layer, and subsequently oxidation proceeds in the second layer 13b and further in the first layer 13a in this order.

When the Mo material constituting the second layer 13b is compared to the material of Ru or a Ru compound, the Mo material is more likely to be oxidized than the material of Ru or Ru compound. Accordingly, when the oxidation of the second layer 13b starts, it is considered that oxidation proceeds in the second layer 13b further significantly than oxidation in the first layer 13a as a lower layer. In other words, it is considered that the oxidation in the first layer 13a is suppressed since the second layer 13b, which is more likely to be oxidized than the material of Ru or Ru compound, is oxidized. Further, it is possible to effectively suppress diffusion in a lower direction than the interface between the second layer 13b and the first layer 13a since oxygen diffusing from the second layer 13b into the first layer 13a is preferentially diffused in a direction toward the interface between the second layer 13b and the first layer 13a.

In comparison of a case where the protective layer is made of a single Ru film (or a single Ru compound film), it is possible to make the Ru layer so as to have a lower crystallization and a smaller amount of crystal grain boundary since the film thickness of each Ru sub-layer (or Ru compound sub-layer) can be made thinner to about ½. Thus, it is possible to effectively suppress the diffusion of oxygen in each Ru sub-layer through the crystal grain boundary.

It is considered that these functions contribute to suppress the oxidation of the Mo/Si multilayer reflective film beneath the first layer 13a, more specifically the oxidation of the Si film as the uppermost layer of the Mo/Si multilayer reflective film, with the result that deterioration in the EUV light reflectivity due to oxidation of the Ru protective layer is prevented.

Deterioration in the EUV light reflectivity due to oxidation of the second layer (Mo layer) (deterioration in the EUV deterioration in the EUV light reflectivity when the surface of the protective layer 13 is irradiated with EUV light) is minor and negligible since the Mo material constituting the second layer 13b is a material having a high EUV light reflectivity as used in the Mo/Si multilayer reflective film and since the second layer 13b has a small film thickness as after-described.

When the Ru protective layer is formed on the Mo/Si multilayer reflective film, Si in the Si film as the uppermost layer of the Mo/Si multilayer reflective film diffuses into the Ru protective layer, thus leading to a problem, in some cases. However, in accordance with the EUV optical member of the present invention, even if there is a situation where Si in the Si film diffuses into a Ru layer or a Ru compound layer as the first layer 13a, the presence of the Mo layer as the second layer 13b suppress diffusion of Si into the third layer 13c lying at a higher position than the second layer 13b. Thus, even if there is a situation where Si in the Si film diffuses into the Ru protective layer during formation of the Ru protective layer, it is possible to suppress at the minimum level the diffusion of Si into the Ru protective layer, more specifically the diffusion of Si into the third layer 13c as the uppermost layer of the Ru protective layer.

In the EUV optical member of the present invention, the content of Si in the Mo layer constituting the second layer 13b is preferably at most 5 at %, more preferably at most 3 at %, further preferably at most 1 at %.

The content of Mo in the Mo layer constituting the second layer 13b is preferably at least 60 at %, more preferably at least 80 at %, further preferably at least 90 at %.

In the EUV optical member of the present invention, the film thickness of the second layer 13b is preferably at least 0.2 nm. When the film thickness is less than 0.2 nm, it is likely that the formation of the second layer 13b becomes incomplete, depending on the film forming conditions, whereby it is likely that the effect to prevent deterioration in the EUV light reflectivity due to oxidation of the Ru protective layer tends to be inadequate.

On the other hand, it is preferred, in consideration of the effect on EUV properties, that the film thickness of the second layer 13b is at most 2 nm, or equal to ½ of the total film thickness of the protective layer 13, whichever is smaller.

What functions as the protective layer for the EUV optical protective layer in the three-layer protective layer 13, i.e. functions to protect the reflective layer from damage by an etching process is the first layer 13a and the third layer 13c, each of which is made of a Ru layer or a Ru compound layer.

When the film thickness of the second layer 13b is larger than ½ of the total film thickness of the protective layer 13, the film thickness of the first layer 13a and the third layer 13c is reduced, whereby the above-described function as the protective layer for the EUV optical member is unlikely to be fulfilled.

When the film thickness of the second layer 13b is larger than 2 nm, the total film thickness of the protective layer 13, which is required to fulfill the above-described function as the protective layer for the EUV optical member, increases, which is likely not only to lead to deteriorate in the EUV light reflectivity but also to make it impossible to ignore deteriorate in the EUV light reflectivity.

The film thickness of the second layer 13b is preferably from 0.3 nm to 1 nm, more preferably from 0.3 nm to 0.6 nm.

The total thickness of the three-layer protective layer 13 is preferably from 1 to 10 nm from the viewpoint that the EUV light reflectivity can be increased and an etching resistant characteristic can be obtained. The total thickness of the protective layer 13 is preferably from 1 to 5 nm, more preferably from 2 to 4 nm.

The film thickness of the first layer 13a and the third layer 13c in the three-layer protective layer 13 is not particularly limited and may be suitably selected within the above-described preferred range of the total thickness of the protective layer 13 and within a range to satisfy the above-described preferred range of the film thickness of the second layer 13b. In order to perform the above-described effect by the formation of the second layer 13b, i.e. the effect to prevent deterioration in the EUV light reflectivity due to oxidation of the Ru protective layer, the film thickness of each of the first layer 13a and the third layer 13c is preferably from 0.6 to 3 nm, more preferably from 0.8 to 1.8 nm. The film thickness of the first layer 13a and the third layer 13c is preferably determined so as to be at most 0.5 nm in a difference in film thickness therebetween.

In the present invention, the surface roughness rms of the surface of the protective layer 13 is preferably at most 0.5 nm. The surface roughness rms having at most 0.5 nm means a root-mean-square surface roughness having at most 0.5 nm. If the surface roughness of the surface of the protective layer 13 is large, the surface roughness of the absorber layer 14 to be formed on the protective layer 13 tends to be large, whereby the edge roughness of a pattern to be formed in the absorber layer 14 tends to be large, and the dimensional precision of the pattern tends to be poor. As the pattern becomes fine, the influence of the edge roughness becomes distinct, and therefore, it is required that the surface of the absorber layer 14 is smooth.

When the surface roughness rms of the surface of the protective layer 13 is at most 0.5 nm, the surface of the absorber layer 14 to be formed on the protective layer 13 will be sufficiently smooth, thus being free from deterioration of the dimensional precision of a pattern due to an influence of the edge roughness. The surface roughness rms of the surface of the protective layer 13 is more preferably at most 0.4 nm, further preferably at most 0.3 nm.

Each layer of the three-layer protective layer 13 may be formed by means of a film forming method, such as a magnetron sputtering method or an ion beam sputtering method.

In a case where a Ru layer is formed as the first layer 13a and the second layer 13c by means of an ion beam sputtering method, discharge may be made in an argon (Ar) atmosphere by using a Ru target as the target. Specifically, the ion beam sputtering may be carried out under the following conditions.

Sputtering gas: Ar (gas pressure: from $1.0 \times 10^{-1}$ to $10 \times 10^{-1}$ Pa, preferably from $1.0 \times 10^{-1}$ to $5.0 \times 10^{-1}$ Pa, more preferably from $1.0 \times 10^{-1}$ to $3.0 \times 10^{-1}$ Pa)

Applied power (for each target): from 30 to 1,000 W, preferably from 50 to 750 W, more preferably from 80 to 500 W Film forming rate: from 0.1 to 6 nm/sec, preferably from 0.1 to 4.5 nm/sec, more preferably from 0.1 to 3 nm/sec On the other hand, in a case where a Mo layer is formed as the second layer 13b by means of an ion beam sputtering method, discharge may be made in an argon (Ar) atmosphere by using a Mo target as the target. Specifically, the ion beam sputtering may be carried out under the following conditions.

Sputtering gas: Ar (gas pressure: from $1.3 \times 10^{-2}$ Pa to $2.7 \times 10^{-2}$ Pa)

Ion accelerating voltage: from 300 to 1,500 V

Film forming rate: from 0.005 to 0.3 nm/sec, preferably from 0.01 to 0.2 nm/sec, more preferably from 0.02 to 0.1 nm/sec The reflective layer-equipped substrate of the present invention is provided to have the multilayer reflective film 12 and the protective layer 13 formed on the film forming surface of the substrate 11 in this order by the above-described procedure. The reflective layer-equipped substrate of the present invention is one constituting a precursor for an EUV mask blank. The EUV mask blank of the present invention is one wherein by the after-described procedure, the absorber layer is formed on the protective layer of the reflective layer-equipped substrate of the present invention, and a low reflective layer is formed on the absorber layer as needed. The reflective layer-equipped substrate of the present invention can be used as an EUV mirror.

The reflective layer-equipped substrate of the present invention is such that when being subjected to thermal treatment in accordance with the procedure described in Examples given hereinafter, deterioration of EUV light reflectivity as between before and after the thermal treatment is at most 7%, more preferably at most 6%.

In the Examples given hereinafter, the thermal treatment is carried out under a severer condition than a heating step to be carried out during the production of a mask blank or a mirror or a heating step to be carried out during the production of a photomask from the mask blank in order to confirm the effect attained by the present invention.

The property particularly required for the absorber layer 14 is that the EUV light reflectivity is very low. Specifically, when the surface of the absorber layer 14 is irradiated with a light ray within a wavelength region of EUV light, the maximum light ray reflectivity in the vicinity of a wavelength of 13.5 nm is preferably at most 0.5%, more preferably at most 0.1%.

In order to attain such a property, it is preferably constituted by a material having a high absorption coefficient of EUV light, and it is preferably formed by a material containing tantalum (Ta) as the main component.

As the absorber layer 14, one containing Ta, B, Si and nitrogen (N) in the following ratio (TaBSiN film) may be mentioned.

Content of B: at least 1 at % and less than 5 at %, preferably from 1 to 4.5 at %, more preferably from 1.5 to 4 at %.

Content of Si: from 1 to 25 at %, preferably from 1 to 20 at %, more preferably from 2 to 12 at %.

Compositional ratio of Ta to N (Ta:N) (atomic ratio): from 8:1 to 1:1.
Content of Ta: preferably from 50 to 90 at %, more preferably from 60 to 80 at %.
Content of N: preferably from 5 to 30 at %, more preferably from 10 to 25 at %.

The absorber layer 14 having the above composition is amorphous in its crystal state and is excellent in the surface smoothness.

The absorber layer 14 having the above composition has a surface roughness of at most 0.5 nm. If the surface roughness of the surface of the absorber layer 14 is large, the edge roughness of a pattern to be formed in the absorber layer 14 tends to be large, and the dimensional precision of the pattern tends to be poor. As the pattern becomes fine, the influence of the edge roughness becomes distinct, and therefore, it is required that the surface of the absorber layer 14 is smooth.

When the surface roughness of the surface of the absorber layer 14 is at most 0.5 nm, the surface of the absorber layer 14 is sufficiently smooth and free from deterioration in the dimensional precision of a pattern due to an influence of the edge roughness. The surface roughness of the surface of the absorber layer 14 is more preferably at most 0.4 nm, further preferably at most 0.3 nm.

With the above-described structure, the absorber layer 14 has a high etching rate when dry etching is carried out by using a chlorine-type gas as the etching gas, and the etching selectivity to the protective layer 13 is at least 10. In this specification, the etching selectivity can be calculated by the following formula (1):

Etching selectivity=(etching rate of absorber layer 14)/(etching rate of protective layer 13)   (1)

The etching selectivity is preferably at least 10, more preferably at least 11, further preferably at least 12.

The thickness of the absorber layer 14 is preferably from 50 to 100 nm. The absorber layer 14 having the above-described structure can be formed by using a film forming method, e.g. a sputtering method, such as a magnetron sputtering method or an ion beam sputtering method.

Figure 2:
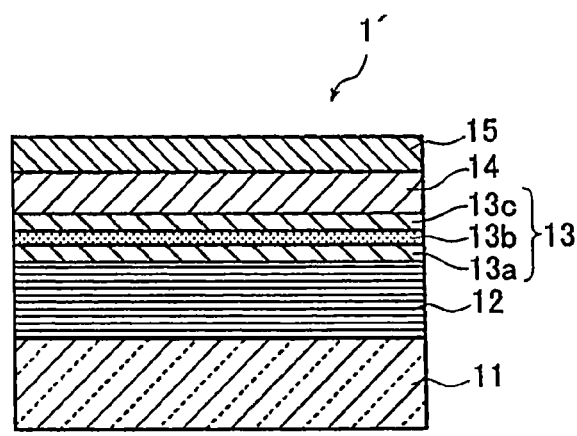
FIG. 2 is a schematic cross-sectional view illustrating an embodiment wherein a low reflective layer is formed on the absorber layer of the EUV mask blank in FIG. 1.

Like the EUV mask blank 1' shown in FIG. 2, the EUV mask blank of the present invention is preferably such that a low reflective layer 15 to an inspection light to be used for inspection of a mask pattern is formed on the absorber layer 14.

At the time of preparing an EUV mask, after forming a pattern in the absorber layer, an inspection is conducted to see if the pattern is formed as designed. In such an inspection of a mask pattern, an inspecting machine is used wherein light having a wavelength of about 257 nm is usually used as the inspection light. That is, the inspection is made by a difference in the reflectivity of such light having a wavelength of about 257 nm, specifically by the difference in the reflectivity between the surface exposed by removal of the absorber layer 14 by the formation of a pattern and the surface of the absorber layer 14 remained without being removed by the formation of the pattern. Here, the former is the surface of the protective layer 13. Therefore, if the difference in the reflectivity between the surface of the protective layer 13 and the surface of the absorber layer 14 to the wavelength of the inspection light is small, the contrast at the time of the inspection becomes poor, and an accurate inspection may not be done.

The absorber layer 14 having the above-described structure has a very low EUV light reflectivity and has an excellent property as an absorber layer for an EUV mask blank, but when viewed with respect to the wavelength of the inspection light, the reflectivity may not be necessarily sufficiently low. As a result, the difference between the reflectivity at the surface of the absorber layer 14 and the reflectivity at the surface of the protective layer 13 at the wavelength of the inspection light tends to be small, and the contrast at the time of the inspection may not sufficiently be obtainable. If the contrast at the time of the inspection cannot be sufficiently obtained, a defect in a pattern cannot sufficiently be detected in the inspection of a mask, and an adequate inspection of a defect may not be carried out.

Like the EUV mask blank 1' shown in FIG. 2, by forming a low reflective layer 15 on the absorber layer 14, the contrast at the time of the inspection will be good. In other words, the reflectivity at a wavelength of the inspection light becomes very low. When irradiated with a light ray within the wavelength region of the inspection light, the low reflective layer 15 to be formed for such a purpose preferably has the maximum reflectivity at the wavelength of the inspection light being at most 15%, more preferably at most 10%, further preferably at most 5%.

When the reflectivity at the wavelength of the inspection light at the low reflective layer 15 is at most 15%, the contrast at the time of the inspection is good. Specifically, the contrast between reflected light with a wavelength of the inspection light at the surface of the protective layer 13 and reflected light with the wavelength of the inspection light at the surface of the low reflective layer 15 becomes at least 30%.

In this specification, the contrast can be obtained by using the following formula (2).

Contrast(%)=(($R_2$−$R_1$)/($R_2$+$R_1$))×100   (2)

Figure 3:
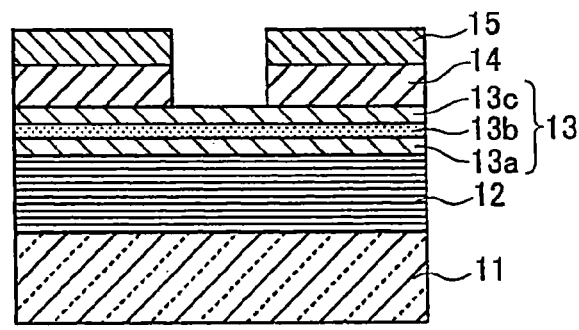
FIG. 3 is a schematic cross-sectional view illustrating an embodiment wherein a pattern is formed in the absorber layer 14 and the low reflective layer 15 of the EUV mask blank 1' in FIG. 2.

Here, $R_2$ at the wavelength of the inspection light is the reflectivity at the surface of the protective layer 13, and $R_1$ is the reflectivity at the surface of the low reflective layer 15. Here, the above $R_1$ and $R_2$ are measured in such a state as shown in FIG. 2 wherein a pattern is formed in the absorber layer 14 and the low reflective layer 15 of the EUV mask blank 1' (i.e. in the state as shown in FIG. 3). The above $R_2$ is a value measured at the surface of the protective layer 13 exposed as the absorber layer 14 and the low reflective layer 15 were removed by formation of a pattern, as shown in FIG. 3, and $R_1$ is a value measured at the surface of the low reflective layer 15 remained without being removed by the formation of the pattern.

In the present invention, the contrast represented by the above formula (2) is more preferably at least 45%, further preferably at least 60%, particularly preferably at least 80%.

To attain the above-described properties, the low reflective layer 15 is preferably constituted by a material having a refractive index lower than the absorber layer 14 at the wavelength of the inspection light, and its crystal state is preferably amorphous.

As a specific example of such a low reflective layer 15, one containing Ta, B, Si and oxygen (O) in the following ratio (low reflective layer (TaBSiO)) may be mentioned.

Content of B: at least 1 at % and less than 5 at %, preferably from 1 to 4.5 at %, more preferably from 1.5 to 4 at %.
Content of Si: from 1 to 25 at %, preferably from 1 to 20 at %, more preferably from 2 to 10 at %.
Compositional ratio of Ta to O (Ta:O)(atomic ratio): from 7:2 to 1:2, preferably from 7:2 to 1:1, more preferably from 2:1 to 1:1.

Further, as a specific example for the low reflective layer 15, one containing Ta, B, Si, O and N in the following ratio (low reflective layer (TaBSiON)) may be mentioned.

Content of B: at least 1 at % and less than 5 at %, preferably from 1 to 4.5 at %, more preferably from 2 to 4.0 at %.

Content of Si: from 1 to 25 at %, preferably from 1 to 20 at %, more preferably from 2 to 10 at %.

Compositional ratio of Ta to O and N (Ta:(O+N))(atomic ratio): from 7:2 to 1:2, preferably from 7:2 to 1:1, more preferably from 2:1 to 1:1.

With the above-described structure, the low reflective layer ((TaBSiO) or (TaBSiON)) is amorphous in its crystal state and is excellent in its surface smoothness. Specifically, the surface roughness rms of the low reflective layer ((TaBSiO) or (TaBSiON)) is preferably at most 0.5 nm.

As mentioned above, in order to prevent deterioration in the dimensional precision of a pattern due to an influence of the edge roughness, it is required that the surface of the absorber layer 14 is smooth. It is also required for the same reason that the surface of the low reflective layer 15 is smooth because of being formed on the absorber layer 14.

When the surface roughness rms of the surface of the low reflective layer 15 is at most 0.5 nm, the surface of the low reflective layer 15 is sufficiently smooth and free from deterioration in the dimensional precision of a pattern due to an influence of the edge roughness. The surface roughness rms of the surface of the low reflective layer 15 is more preferably at most 0.4 nm, further preferably at most 0.3 nm.

In a case where the low reflective layer 15 is formed on the absorber layer 14, the total thickness of the absorber layer 14 and the low reflective layer 15 is preferably from 55 to 130 nm. Further, if the thickness of the low reflective layer 15 is more than the thickness of the absorber layer 14, the EUV absorbing property at the absorber layer 14 is likely to be low, and therefore, the thickness of the low reflective layer 15 is preferably less than the thickness of the absorber layer 14. For this purpose, the thickness of the low reflective layer 15 is preferably from 5 to 30 nm, more preferably from 10 to 20 nm.

The low reflective layer ((TaBSiO) or (TaBSiON)) may be formed by using a film forming method, e.g. a sputtering method, such as a magnetron sputtering method or an ion beam sputtering method.

Here, the reason as to why it is preferred to form a low reflective layer 15 on the absorber layer 14 as in the EUV mask blank 1' shown in FIG. 2, is that the wavelength of the inspection light for a pattern is different from the wavelength of EUV light. Therefore, in a case where EUV light (in the vicinity of 13.5 nm) is used as the inspection light for a pattern, it is considered unnecessary to form a low reflective layer 15 on the absorber layer 14. The wavelength of the inspection light tends to shift toward a low wavelength side as the size of a pattern becomes small, and in future, it is considered to be shifted to 193 nm or further to 13.5 nm. In the case where the wavelength of the inspection light is 13.5 nm, it is considered unnecessary to form a low reflective layer 15 on the absorber layer 14.

The EUV mask blank of the present invention may have a functional film known in the field of EUV mask blanks, in addition to the reflective layer 12, the protective layer 13, the absorber layer 14 and the low reflective layer 15. A specific example of such a functional film may, for example, be a high dielectric constant coating formed on the rear side of the substrate to promote the electrostatic chucking of the substrate, as disclosed in e.g. JP-A-2003-501823 (which is incorporated in this specification by reference). Here, in the substrate shown in FIG. 1, the rear side of the substrate means the surface on the opposite side to the side where the reflective layer 12 is formed. For the high dielectric constant coating to be formed on the rear side of the substrate for such a purpose, the electrical conductivity and the thickness of the constituting material are selected so that the sheet resistance will be at most 100Ω/□. The constituting material of the high dielectric constant coating may be selected widely from those disclosed in known literatures. For example, a high dielectric constant coating disclosed in JP-A-2003-501823, specifically a coating comprising silicon, TiN, molybdenum, chromium and TaSi may be applied. The thickness of the high dielectric constant coating may, for example, be from 10 to 1,000 nm.

The high dielectric constant coating may be formed by means of a sputtering method, such as a magnetron sputtering method or an ion beam sputtering method, a CVD method, a vacuum vapor deposition method or an electroplating method.

The EUV mirror may also have the above-described high dielectric constant coating.

The EUV mask of the present invention may be produced by patterning at least the absorber layer of the EUV mask blank of the present invention (in a case where a low reflective layer is formed on the absorber layer, the absorber layer and the low reflective layer). The method for patterning the absorber layer (in a case where a low reflective layer is formed on the absorber layer, the absorber layer and the low reflective layer), is not particularly limited. For example, a method may be employed wherein a resist is applied on the absorber layer (in a case where a low reflective layer is formed on the absorber layer, the absorber layer and the low reflective layer) to form a resist pattern, and by using it as a mask, the absorber layer (in a case where a low reflective layer is formed on the absorber layer, the absorber layer and the low reflective layer) is subjected to etching. The material for the resist, or the drawing method for the resist pattern may suitably be selected in consideration of e.g. the material of the absorber layer (in a case where a low reflective layer is formed on the absorber layer, the absorber layer and the low reflective layer). Also, the method for etching the absorber layer (in a case where a low reflective layer is formed on the absorber layer, the absorber layer and the low reflective layer) is not particularly limited, and dry etching, such as reactive ion etching, or wet etching may be employed. After patterning the absorber layer (in a case where a low reflective layer is formed on the absorber layer, the absorber layer and the low reflective layer), the resist is removed by a remover liquid to obtain the EUV mask of the present invention.

The process for producing a semiconductor circuit by employing the EUV mask according to the present invention will be described. The present invention may be applied to a process for producing a semiconductor integrated circuit by means of a photolithography method using EUV light as the light source for exposure. Specifically, a substrate, such as a silicon wafer, coated with a resist is disposed on a stage, and the above EUV mask is set on a reflective exposure apparatus combined with a reflective mirror. And, EUV light from a light source is applied to the EUV mask via the reflective mirror to have the EUV light reflected by the EUV mask and is applied to the substrate coated with the resist. By such a pattern transfer step, a circuit pattern is transferred to the substrate. The substrate having a circuit pattern transferred thereto is subjected to etching of sensitized or non-sensitized portions by development, followed by peeling of the resist. A semiconductor integrated circuit is produced by repeating such a process.

EXAMPLES

Now, the present invention will be described in further detail with reference to Examples.

Example 1

In this Example, a mask blank 1' as shown in FIG. 2 was prepared.

As a substrate 11 for film formation, a SiO$_2$—TiO$_2$ type glass substrate (size: 6 inches (152.4 mm) square, thickness: 6.3 mm) was used. The thermal expansion coefficient of this glass substrate is 0.2×10$^{-7}$/° C., the Young's modulus is 67 GPa, the Poisson ratio is 0.17, and the specific rigidity is 3.07×10$^7$ m$^2$/s$^2$. This glass substrate was polished to form a smooth surface having a surface roughness rms of at most 0.15 nm and a planarity of at most 100 nm.

On the rear surface side of the substrate 11, a Cr film having a thickness of 100 nm was formed by a magnetron sputtering method to provide a high dielectric constant coating (not shown in the drawings) having a sheet resistance of 100Ω/□.

By using the formed Cr film, the substrate 11 (size: 6 inches (152.4 mm) square, thickness: 6.3 mm) was fixed to a usual electrostatic chuck of a flat plate shape, and on the surface of the substrate 11, a Mo film and then a Si film were alternately formed by means of an ion beam sputtering method for 50 cycles to form a Mo/Si multilayer reflective film (reflective layer 12) having a total thickness of 340 nm ((2.3 nm+4.5 nm)×50). Here, the uppermost layer of the Mo/Si multilayer reflective film is a Si film.

The film forming conditions for the Mo film and the Si film are as follows.

(Film Forming Conditions for Mo Film)
Target: Mo target
Sputtering gas: Ar gas (gas pressure: 0.02 Pa)
Voltage: 700 V
Film forming rate: 0.064 nm/sec
Film thickness: 2.3 nm (Film Forming Conditions for Si Film)
Target: Si target (boron-doped)
Sputtering gas: Ar gas (gas pressure: 0.02 Pa)
Voltage: 700 V
Film forming rate: 0.077 nm/sec
Film thickness: 4.5 nm Then, on the reflective layer 12, a Ru layer was formed as the first layer 13a of a protective layer 13 by means of an ion beam sputtering method.

The forming conditions for the first layer 13a are as follows.
Target: Ru target
Sputtering gas: Ar gas (gas pressure: 0.02 Pa)
Voltage: 700 V
Film forming rate: 0.052 nm/sec
Film thickness: 1.25 nm Then, a Mo layer was formed as the second layer 13b of the protective layer 13 by means of an ion beam sputtering method.

The forming conditions for the second layer 13b are as follows.
Target: Mo target
Sputtering gas: Ar gas (gas pressure: 0.02 Pa)
Voltage: 700 V
Film forming rate: 0.064 nm/sec
Film thickness: 0.5 nm Then, a Ru layer was formed as the third layer 13c of the protective layer 13 by means of an ion beam sputtering method.

The forming conditions for the third layer 13c are as follows.
Target: Ru target
Sputtering gas: Ar gas (gas pressure: 0.02 Pa)
Voltage: 700 V
Film forming rate: 0.052 nm/sec
Film thickness: 1.25 nm Then, on the protective layer 13, more specifically on the third layer 13c of the protective layer 13, a TaBSiN layer is formed as an absorber layer 14 by means of a magnetron sputtering method.

The film forming conditions for the TaBSiN layer are as follows.

(Film Forming Conditions for TaBSiN Layer)
Target: TaBSi compound target (compositional ratio: Ta 80 at %, B 10 at %, Si 10 at %).
Sputtering gas: mixed gas of Ar and N$_2$ (Ar: 86 vol %, N$_2$: 14 vol %, gas pressure: 0.3 Pa)
Applied power: 150 W
Film forming rate: 0.12 nm/sec
Film thickness: 60 nm Then, on the absorber layer 14, a TaBSiON layer is formed as a low reflective layer 15 by means of a magnetron sputtering method, to obtain a mask blank 1' as shown in FIG. 2.

The film forming conditions for the TaBSiON film are as follows.

(Film Forming Conditions for TaBSiON Layer)
Target: TaBSi target (compositional ratio: Ta 80 at %, B 10 at %, Si 10 at %)
Sputtering gas: mixed gas of Ar, N$_2$ and O$_2$ (Ar: 60 vol %, N$_2$: 20 vol %, O$_2$: 20 vol %, gas pressure: 0.3 Pa)
Applied power: 150 W
Film forming rate: 0.18 nm/sec
Film thickness: 10 nm With respect to the mask blank obtained by the above procedure, the following evaluations are carried out.

(1) Film Composition

With respect to a sample formed up to the protective layer 13 by the above-described procedure, by measuring the composition in the depth direction from the surface of the protective layer 13 to the reflective layer (Mo/Si multilayer reflective film) 12 by means of an X-ray Photoelectron Spectrometer (Quantera SXM, manufactured by ULVAC-PHI, Inc.), it was confirmed that the protective layer 13 had the following three-layer structure.

First layer 13a: Ru layer
Second layer 13b: Mo layer
Third layer 13c: Ru layer

From the measurement results of an X-ray Photoelectron Spectrometer, it was confirmed that the composition of Mo to the total composition of the protective layer 13 was 20%. This result shows that Mo was contained in the protective layer 13 in a composition amount consistent with the relationship between the total film thickness of the protective layer 13 (1.25+0.5+1.25=3 nm) and the film thickness of the second layer 13b (0.5 nm) under the above-described film forming conditions.

(2) Surface Roughness

The surface roughness of the protective layer 13 was confirmed by means of an Atomic Force Microscope (No. SPI3800, manufactured by Seiko Instruments Inc.) in accordance with JIS-B0601 (1994). The surface roughness rms of the protective layer 13 was 0.15 nm.

(3) thermal treatment durability

To a sample formed up to the protective layer 13 by the above-described procedure, thermal treatment (in the atmospheric air) at 210° C. for 10 minutes was applied. Before and after this treatment, the EUV reflectivity was measured by means of an EUV reflectivity meter (MBR (product name), manufactured by AIXUV) by applying EUV light (wavelength: 13.5 nm) to the surface of the protective layer 13. Deterioration in the EUV reflectivity as between before and after this treatment was 5.4%.

(4) Reflection Properties (Evaluation of Contrast)

With respect to a sample formed up to the protective layer 13 by the above-described procedure, the reflectivity of a pattern inspection light (wavelength: 257 nm) at the surface of the protective layer 13 is measured by means of a spectrophotometer. Further, with respect to a sample formed up to the low reflective layer 15, the reflectivity of the pattern inspection light at the surface of the low reflective layer 15 is measured. As the results, the reflectivity at the surface of the protective layer 13 is 60.0%, and the reflectivity at the surface of the low reflective layer 15 is 6.9%. The contrast is obtained by using these results and the above-mentioned formula (2) and find to be 79.4%.

With respect to the obtainable EUV mask blank 1', the surface of the low reflective layer 15 is irradiated with EUV light (wavelength: 13.5 nm), whereby the reflectivity of EUV light is measured. As a result, the reflectivity of EUV light is 0.4%, whereby it is confirmed that the EUV absorption property is excellent.

Comparative Example 1

Comparative Example 1 was carried out in the same procedure as in Example 1 except that a single Ru layer was formed as the protective layer 13 by means of an ion beam sputtering method.

The film forming conditions for the Ru film are as follows.
(Film Forming Conditions for Ru Film)
Target: Ru target
Sputtering gas: Ar gas (gas pressure: 0.02 Pa)
Voltage: 700 V
Film forming rate: 0.052 nm/sec
Film thickness: 3 nm With respect to the mask blank obtained in the above-described procedure, the following evaluations were carried out.

(1) Film Composition

With respect to a sample formed up to the protective layer 13 by the above-described procedure, the composition in the depth direction from the surface of the protective layer 13 to the reflective layer 12 was measured by means of the X-ray Photoelectron Spectrometer (Quantera SXM, manufactured by ULVAC-PHI, Inc.). It was detected that the protective layer 13 was made of a single Ru layer, and that no composition of Mo was in the protective layer 13.

(2) Surface Roughness

With respect to the sample formed up to the protective layer 13 by the above-described procedure, the surface roughness of the protective layer 13 was confirmed by means of the Atomic Force Microscope (No. SPI3800, manufactured by Seiko Instruments Inc.) in accordance with JIS-B0601 (1994). The surface roughness rms of the protective layer 13 was 0.15 nm.

(3) Thermal Treatment Durability

To a sample formed up to the protective layer 13 by the above-described procedure, thermal treatment (in the atmospheric air) at 210° C. for 10 minutes was applied. Before and after this treatment, the EUV reflectivity was measured by means of the EUV reflectivity meter by applying EUV light (wavelength: 13.5 nm) to the surface of the protective layer 13. Deterioration in the EUV reflectivity as between before and after this treatment was 7.8%.

From this result, it was confirmed that the mask blank in Comparative Example 1 was inferior in the thermal treatment durability as compared with the mask blank in Example 1.

Example 2

In this Example, an EUV mirror 2 as shown in FIG. 4 was prepared.

As a substrate 11 for film formation, a $SiO_2$—$TiO_2$ type glass substrate (size: 6 inches (152.4 mm) square, thickness: 6.3 mm) was used. The thermal expansion coefficient of this glass substrate is $0.2 \times 10^{-7}$/° C., the Young's modulus is 67 GPa, the Poisson ratio is 0.17, and the specific rigidity is $3.07 \times 10^7$ m²/s². This glass substrate was polished to form a smooth surface having a surface roughness rms of at most 0.15 nm and a planarity of at most 100 nm.

On the rear side of the substrate 11, a Cr film having a thickness of 100 nm was formed by a magnetron sputtering method to provide a high dielectric constant coating (not shown in the drawings) having a sheet resistance of 100Ω/□.

By using the formed Cr film, the substrate 11 (size: 6 inches (152.4 mm) square, thickness: 6.3 mm) was fixed to a usual electrostatic chuck of a flat plate shape, and on the surface of the substrate 11, a Mo film and then a Si film were alternately formed by means of an ion beam sputtering method for 50 cycles to form a Mo/Si multilayer reflective film (reflective layer 12) having a total thickness of 340 nm ((2.3 nm+4.5 nm)×50). Here, the uppermost layer of the Mo/Si multilayer reflective film is a Si film. The film forming conditions for the Mo film and the Si film are as follows.

(Film Forming Conditions for Mo Layer)
Target: Mo target
Sputtering gas: Ar gas (gas pressure: 0.02 Pa)
Voltage: 700 V
Film forming rate: 0.064 nm/sec
Film thickness: 2.3 nm (Film Forming Conditions for Si Film)
Target: Si target (boron-doped)
Sputtering gas: Ar gas (gas pressure: 0.02 Pa)
Voltage: 700 V
Film forming rate: 0.077 nm/sec
Film thickness: 4.5 nm Then, on the reflective layer 12, a Ru layer was formed as the first layer 13a of a protective layer 13 by means of an ion beam sputtering method.

The forming conditions for the first layer 13a are as follows.
Target: Ru target
Sputtering gas: Ar gas (gas pressure: 0.02 Pa)
Voltage: 700 V
Film forming rate: 0.052 nm/sec
Film thickness: 1.25 nm Then, a Mo layer was formed as the second layer 13b of the protective layer 13 by means of an ion beam sputtering method.

The forming conditions for the second layer 13b are as follows.
Target: Mo target
Sputtering gas: Ar gas (gas pressure: 0.02 Pa)
Voltage: 700 V
Film forming rate: 0.064 nm/sec
Film thickness: 0.5 nm Then, a Ru layer was formed as the third layer 13c of the protective layer 13 by means of an ion beam sputtering method.

The forming conditions for the third layer 13c are as follows.
Target: Ru target
Sputtering gas: Ar gas (gas pressure: 0.02 Pa)
Voltage: 700 V
Film forming rate: 0.052 nm/sec
Film thickness: 1.25 nm With respect to the EUV mirror obtained in the above-described procedure, the following evaluations were carried out.

(1) Film Composition

By measuring the composition in the depth direction from the surface of the protective layer 13 to the reflective layer (Mo/Si multilayer reflective film) 12 by means of the X-ray Photoelectron Spectrometer (Quantera SXM, manufactured by ULVAC-PHI, Inc.), it was confirmed that the protective layer 13 had the following three-layer structure.

First layer 13*a*: Ru layer
Second layer 13*b*: Mo layer
Third layer 13*c*: Ru layer From the measurement results of the X-ray Photoelectron Spectrometer, it was confirmed that the composition of Mo to the total composition of the protective layer 13 was 20%. This result shows that Mo was contained in the protective layer 13 in a composition amount consistent with the relationship between the total film thickness of the protective layer 13 (1.25+0.5+1.25=3 nm) and the film thickness (0.5 nm) of the second layer 13*b* under the above-described film forming conditions.

(2) Surface Roughness

The surface roughness of the protective layer 13 was confirmed by means of the Atomic Force Microscope (No. SPI3800, manufactured by Seiko Instruments Inc.) in accordance with JIS-B0601 (1994). The surface roughness rms of the protective layer 13 was 0.15 nm.

(3) Thermal Treatment Durability

The EUV mirror was subjected to thermal treatment (in the atmospheric air) at 210° C. for 10 minutes. Before and after this treatment, the EUV reflectivity was measured by means of the EUV reflectivity meter by applying EUV light (wavelength: 13.5 nm) to the surface of the protective layer 13. Deterioration in the EUV reflectivity as between before and after this treatment was 5.4%.

INDUSTRIAL APPLICABILITY

In the reflective layer-equipped substrate of the present invention, and the EUV mask blank and the EUV mirror employing the reflective layer-equipped substrate of the present invention, deterioration in the EUV light reflectivity due to oxidation of the Ru protective layer is prevented. By suppressing the change with time of the EUV light reflectivity during the EUV exposure, it becomes unnecessary to change the exposure conditions in a half way, and it is possible to prolong the useful life of a photomask.

Further, an EUV mask prepared by employing the EUV mask blank of the present invention is a highly reliable EUV mask with little change with time of the EUV light reflectivity during the EUV exposure and is useful for the production of a semiconductor integrated circuit having a fine pattern.

This application is a continuation of PCT Application No. PCT/JP2010/072047, filed on Dec. 8, 2010, which is based upon and claims the benefit of priority from Japanese Patent Application No. 2009-279401 filed on Dec. 9, 2009. The contents of those applications are incorporated herein by reference in its entirety.

REFERENCE SYMBOLS

1 and 1': EUV mask blank
2: EUV mirror
11: Substrate
12: Multilayer reflective film
13: Reflective layer
13*a*: First layer
13*b*: Second layer
13*c*: Third layer
14: Absorber layer
15: Low reflective layer

What is claimed is:

1. A reflective layer-equipped substrate for EUV lithography, comprising:
a substrate;
a reflective layer which reflects EUV light and is formed on the substrate; and
a protective layer which protects the reflective layer and is formed on the reflective layer,
wherein the reflective layer is a Mo/Si multilayer reflective film, the protective layer has a three-layer structure having a first layer made of a Ru layer or a Ru compound layer and laminated on the reflective layer, a second layer made of a Mo layer and laminated on the first layer, and a third layer made of a Ru layer or a Ru compound layer and laminated on the second layer.

2. The reflective layer-equipped substrate for EUV lithography according to claim 1, wherein the reflective layer includes a Si film forming an uppermost layer of the Mo/Si multilayer reflective film, and the protective layer is formed in contact with the Si film.

3. The reflective layer-equipped substrate for EUV lithography according to claim 1, wherein the second layer has a film thickness which is in a range of at least 0.2 nm and at most 2 nm.

4. The reflective layer-equipped substrate for EUV lithography according to claim 1, wherein the protective layer has a total thickness which is in a range of from 1 to 10 nm.

5. The reflective layer-equipped substrate for EUV lithography according to claim 1, wherein the protective layer has a surface having a surface roughness which is at most 0.5 nm in rms.

6. A reflective mirror for EUV lithography, comprising the reflective layer-equipped substrate for EUV lithography as defined in claim 1.

7. The reflective layer-equipped substrate for EUV lithography according to claim 1, wherein the second layer has a film thickness which is equal to ½ of a total film thickness of the protective layer.

8. The reflective layer-equipped substrate for EUV lithography according to claim 2, wherein the second layer has a film thickness which is in a range of at least 0.2 nm and at most 2 nm.

9. The reflective layer-equipped substrate for EUV lithography according to claim 2, wherein the protective layer has a total thickness which is in a range of from 1 to 10 nm.

10. The reflective layer-equipped substrate for EUV lithography according to claim 2, wherein the Mo layer of the protective layer has a Mo content of 60 at %.

11. A reflective mask blank for EUV lithography, comprising:
a substrate;
a reflective layer which reflects EUV light and is formed on the substrate;
a protective layer which protects the reflective layer and is formed on the reflective layer; and
an absorber layer formed on the protective layer,
wherein the reflective layer is a Mo/Si multilayer reflective film, the protective layer has a three-layer structure having a first layer made of a Ru layer or a Ru compound layer and laminated on the reflective layer, a second layer made of a Mo layer and laminated on the first layer, and a third layer made of a Ru layer or a Ru compound layer and laminated on the second layer.

12. The reflective mask blank for EUV lithography according to claim 11, wherein the absorber layer is made of a material comprising tantalum as a main component.

13. The reflective mask blank for EUV lithography according to claim 11, wherein the protective layer and the absorber layer have an etching selectivity of at least 10 between the protective layer and the absorber layer for dry etching.

14. The reflective mask blank for EUV lithography according to claim 11, further comprising:
a low reflective layer for inspection of a mask pattern by an inspection light, wherein the low reflective layer is made of a material comprising tantalum as a main component and is formed on the absorber layer.

15. The reflective mask blank for EUV lithography according to claim 14, wherein the low reflective layer has a contrast of at least 30% between reflected light on a surface of the protective layer and reflected light on a surface of the low reflective layer to a wavelength of light for the inspection of a pattern to be formed in the absorber layer.

16. A reflective mask for EUV lithography obtainable by patterning the EUV reflective mask blank as defined in claim 11.

17. A process for producing a semiconductor integrated circuit, comprising:
subjecting an object to be exposed to exposure through the EUV mask as defined in claim 16.

18. The reflective mask blank for EUV lithography according to claim 11, wherein the second layer has a film thickness which is in a range of at least 0.2 nm and at most 2 nm.

19. The mask blank for EUV lithography according to claim 11, wherein the protective layer has a total thickness which is in a range of from 1 to 10 nm.

20. The mask blank for EUV lithography according to claim 11, wherein the Mo layer of the protective layer has a Mo content of 60 at %.

* * * * *